United States Patent
Passemard et al.

(10) Patent No.: US 7,064,061 B2
(45) Date of Patent: Jun. 20, 2006

(54) PROCESS FOR FABRICATING INTERCONNECT NETWORKS

(75) Inventors: Gérard Passemard, Lumbin (FR); Emmanuel Sicurani, Meylan (FR); Charles Lecornec, Grenoble (FR)

(73) Assignees: STMicroelectronics SA, Montrouge (FR); Commissariat a l'Energie Atomique, Paris Cedex (FR)

( * ) Notice: Subject to any disclaimer, the term of this patent is extended or adjusted under 35 U.S.C. 154(b) by 0 days.

(21) Appl. No.: 10/466,828

(22) PCT Filed: Jan. 17, 2002

(86) PCT No.: PCT/FR02/00186

§ 371 (c)(1),
(2), (4) Date: Nov. 24, 2003

(87) PCT Pub. No.: WO02/058134

PCT Pub. Date: Jul. 25, 2002

(65) Prior Publication Data

US 2004/0115910 A1    Jun. 17, 2004

(30) Foreign Application Priority Data

Jan. 18, 2001    (FR) .................................. 01 00680

(51) Int. Cl.
*H01L 21/4763* (2006.01)
(52) U.S. Cl. ..................... 438/639; 438/622; 438/623; 438/637; 438/738
(58) Field of Classification Search ................ 438/639, 438/622–623, 637, 738
See application file for complete search history.

(56) References Cited

U.S. PATENT DOCUMENTS

| | | | | |
|---|---|---|---|---|
| 6,180,518 | B1 * | 1/2001 | Layadi et al. | 438/639 |
| 6,291,333 | B1 * | 9/2001 | Lou | 438/618 |
| 6,333,265 | B1 * | 12/2001 | Dixit et al. | 438/680 |
| 2001/0051420 | A1 * | 12/2001 | Besser et al. | 438/597 |

* cited by examiner

*Primary Examiner*—Luan Thai
(74) *Attorney, Agent, or Firm*—Lisa K. Jorgenson; Allen, Dyer, Doppelt, Milbrath & Gilchrist, P.A.

(57) ABSTRACT

The process includes depositing a filling material in trenches formed in at least one layer of dielectric so as to fill open pores in the dielectric. The filling material is intended to prevent the subsequent diffusion of the interconnect metal and/or of a metal of a diffusion barrier, and may be non-porous. The filling material preferably has a low dielectric constant.

16 Claims, 2 Drawing Sheets

PROCESS FOR FABRICATING INTERCONNECT NETWORKS

FIELD OF THE INVENTION

The present invention relates to interconnect networks for integrated circuits, and more particularly to copper interconnects formed by the damascene process.

BACKGROUND OF THE INVENTION

Interconnect structures for integrated circuits are conventionally made of aluminum doped with between 2 and 4% copper. In this case, the process includes depositing the metal, then etching it to form the interconnect network and finally deposit on top of it the dielectric which will serve both as lateral insulation of the lines and as vertical insulation of the metal levels. To improve the performance of the circuits, especially in terms of speed and consumption, copper interconnects are used. This is because, with the low resistively of copper, which is almost half that of copper-doped aluminum, such interconnects allow the resistances $R_{int}$ to be reduced. A drawback with this approach is that copper is very difficult to etch.

A process, known as the damascene process, has therefore been developed and has replaced the etching of the metal. According to the damascene process, as described in Patent Application FR 2 794 286, trenches are firstly etched in a generally porous dielectric of low dielectric constant, then a diffusion barrier, made of a metal or a metal nitride (for example Ta, Ti, TiN, TaN), is deposited as a layer lining the walls of these trenches and then the interconnect metal is deposited in the trenches. Finally, the copper on the surface of the dielectric is "planed" by chemical-mechanical polishing (CMP) so as to leave metal only in the trenches.

However, during deposition of the metal barriers and then of the metal in the trenches etched in the dielectric, the metal may diffuse into the open pores thereof to a greater or lesser depth. Thus, there is a rapid change in the nature of the material, which then loses its insulating function. Furthermore, because of electronic component miniaturization, the metal lines are coming closer and closer together, being separated by a mean distance of the order of 0.1 μm. These small dimensions and the degradation of the dielectric mean that there is a risk of forming short circuits and of degrading the lateral capacitance between two metal lines. Such manifestations impair the proper performance of the electronic components produced.

Thus, it has been envisaged, as described in the Texas Instruments document "MRS Proc. Vol. 511, p. 213" to plug the open pores of the dielectric material using a layer of silicon oxide. However, with a conventional silicon oxide deposited by PECVD (Plasma Enhanced Chemical Vapour Deposition), the metal cannot be deposited properly because of the inhomogeneity of the silica layer. Another drawback associated with depositing an oxide layer is the degradation of the lateral capacitance between two metal lines, resulting in a stray capacitance, because of the high dielectric constant of the oxide (which is about 4).

SUMMARY OF THE INVENTION

The present invention provides a process for fabricating an interconnect network which overcomes these drawbacks.

In particular, the present invention provides a process for fabricating an interconnect network which reduces the diffusion of metal into the open pores of the dielectric, thus making it possible to reduce the formation of short circuits and of induced effects of one line of the network on another.

The invention provides a process for fabricating an interconnect network, comprising the deposition of an interconnect metal, characterized in that, prior to the deposition of the interconnect metal, a filling material is deposited in trenches formed in at least one layer of dielectric so as to fill open pores in the dielectric. The filling material is intended to prevent the subsequent diffusion of the interconnect metal and/or of a metal of a diffusion barrier, and may be non-porous. The filling material preferably has a low dielectric constant. The term "material having a low dielectric constant" is understood to mean a material whose dielectric constant is less than 4.

The process may also include deposition of the filling material, deposition of a diffusion barrier in the trenches, and deposition of the interconnect material. The trenches may be formed in at least one layer of dielectric. Preferably, the trenches are formed in two layers of dielectric.

The process is particularly suitable for the production of double damascene structures. The process may thus comprise the following successive steps: formation of a first layer of dielectric; deposition of a stop layer on the first layer of dielectric; etching of the first layer of dielectric in order to form a trench; deposition of a second layer of dielectric; etching of the second layer of dielectric; deposition of a filling material so as to fill the open pores in the two layers of dielectric; removal of the filling material, except in the open pores in the two layers of dielectric, this step being optional; deposition of a diffusion barrier; and deposition of an interconnect metal. The filling material may be removed, except from the open pores in the dielectric. The filling material may be a polymer.

According to a preferred method of implementing the process of the invention, the polymer is an aromatic polymer, for example of the polyarylether type, or else a thermally stable aromatic polymer. The interconnect metal may comprise copper.

The non-porous filling material preferably has a decomposition temperature or melting point above 450° C. Its dielectric constant may be less than 4, and is preferably between 2.5 and 3.5. More particularly, a polymer will be chosen whose dielectric constant is between 2.6 and 2.8. Furthermore, the filling material according to the invention may have a high filling capacity. Thus, in particular, it may be capable of filling pores less than 100 nm, preferably less than 20 nm and even more preferably less than 10 nm in size.

The filling material may be deposited in various conventional ways. It may be envisaged to deposit it by CVD (Chemical Vapor Deposition) or by spin-on coating. However, according to one particularly advantageous variant of the process of the invention, the filling material is in dispersed form and deposited by spin-on coating. In a preferred embodiment, the material deposited is then crosslinked. The filling material may then be removed from the trenches. It may be envisaged to remove it using a directional anisotropic oxidizing plasma, thus leaving the pores in the low-dielectric-constant porous material plugged.

According to a preferred method of implementing the process of the invention, the structure obtained at this stage in the process is subjected to a cleaning step, for example by spraying or by dipping. The process of the invention is then continued conventionally, by depositing a diffusion barrier and an interconnect metal. Preferably, the interconnect metal comprises copper.

The invention also relates to a semiconductor device comprising an interconnect network comprising at least one layer of dielectric and at least one interconnect line or at least one interconnect via formed in a trench, characterized in that, since the dielectric has open pores, the device includes a material for filling said open pores, the filling material being placed between the dielectric and the interconnect lines or vias. Preferably, the filling material is located in the open pores in the dielectric, that is to say the open pores in the walls of the trench. The filling material may have the characteristics described above.

The semiconductor device may especially have a double damascene structure. In this case, the device comprises two layers of dielectric. The device may thus comprise: two layers of dielectric; a filling material for filling the open pores in the walls of a trench formed in the two layers of dielectric, said filling material being located in said open pores; and a diffusion barrier and/or an interconnect metal, filling the trench. Preferably, the interconnect network is based on copper.

The process according to the invention is very suitable for the production of interconnects with a single damascene or double damascene structure having several metal levels. Further advantages and characteristics of the invention will become apparent on examining the detailed description of an entirely nonlimiting method of implementing the process of the invention.

BRIEF DESCRIPTION OF THE DRAWINGS

The rest of the description refers to FIGS. 1 to 4 and to the main steps of the process for fabricating an interconnect network with a double damascene structure having one metal level according to this method of implementing the process of the invention.

DETAILED DESCRIPTION OF THE PREFERRED EMBODIMENTS

Figure 1:
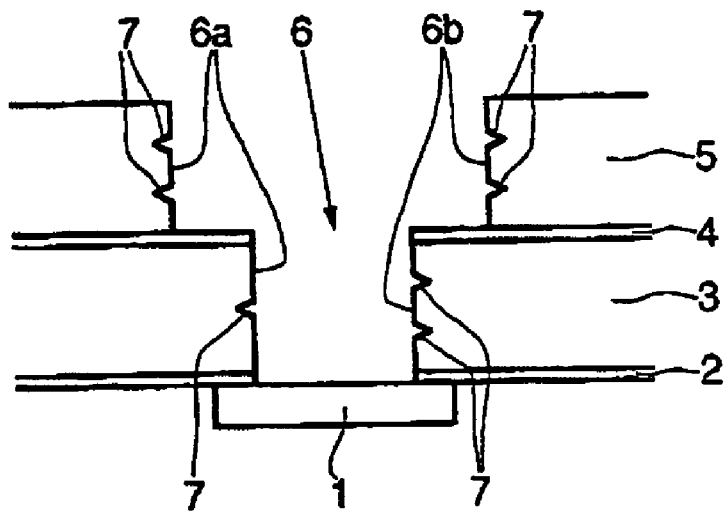
FIGS. 1 to 4 are cross sections through the interconnect device, illustrating the various steps of the fabrication process of the invention.

FIG. 1 shows a metal contact pad 1 on a wafer. The metal used is a standard interconnect metal, such as copper, aluminum or tungsten. However, the process of the invention is particularly suitable for the production of interconnects comprising copper. Deposited successively on this metal contact pad 1 are a barrier layer 2 and a layer 3 of a dielectric called ILD (Inter-Layer Dielectric). The barrier layer 2 may, for example, be an inorganic dielectric.

Next, a stop layer 4 is deposited on the layer 3 and then the layer 3 is etched to produce trenches 6. The trenches 6 have walls 6a and 6b which are generally perpendicular to the upper surface of the stop layer 4. A layer 5 of dielectric called IMD (Inter-Metal Dielectric) is then deposited. This deposition is followed by etching of the layers 3 and 5, for example by dry fluorine etching.

In the double damascene process, the same low-dielectric-constant dielectric is generally used to produce the layers 3 and 5. The expression "low-dielectric-constant dielectric" is understood to mean a material whose dielectric constant is less than 4. The material may be porous, or even mesoporous with a mean pore size of less than 10 nm, or even of between 3 and 6 nm, with a distribution ranging between 1 and 20 nm.

Figure 2:
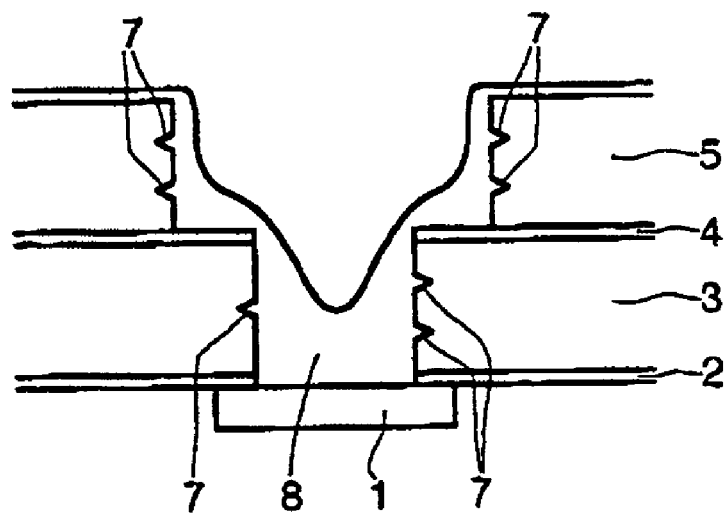

This dielectric may be an inorganic, organic or hybrid dielectric. Examples include porous methyl silesquioxane, a xerogel or other inorganic materials having a porous structure. A xerogel whose dielectric constant is about 2 will be preferred. Next, prior to depositing a diffusion barrier 9, a filling material 8 is deposited on the layer 5 and on the walls 6a and 6b of the trenches 6 (see FIG. 2). This is because it turns out that the walls 6a and 6b of the trenches 6 have a certain number of open pores 7, which the filling material 8 is capable of filling.

According to an embodiment of the invention, the filling material 8 is thermally stable. Its decomposition temperature or melting point is preferably above 450° C., especially so as to be able to withstand the possible annealing operations during fabrication of the electronic components. The filling material 8 must be non-porous, although it can have a certain free volume so as to obtain a low dielectric constant. The term "non-porous" is understood to mean that its porosity prevents the interconnect metal and/or the metal of the metal barrier from diffusing into the open pores in the dielectric.

The filling material 8 preferably has a low dielectric constant so as to avoid excessively strong interactions between the metal lines of the network which are often separated by only approximately 0.1 μm. For example, filling materials 8 having a dielectric constant of less than 4, and preferably between 2.5 and 3.5, are used. More particularly, a filling material 8 having a dielectric constant of between 2.6 and 2.8 will be chosen. Apart from these characteristics, the filling material 8 may also have a high filling capacity, so as to be able to fill the open pores 7, having a size of very much less than 100 nm, in the layers 3 and 5 of the dielectric. The size of the pores in the dielectrics used may in fact be as low as 20 nm, or even 10 nm.

Moreover, it is preferable for the filling material 8 to be compatible with the subsequent deposition of a diffusion barrier 9, that is to say that it is desirable for there to be no degradation induced by the deposition of the diffusion barrier 9 by PVD (Physical Vapor Deposition) or CVD (Chemical Vapor Deposition). Furthermore, because the diffusion barrier 9 may be deposited by CVD it is preferable for the filling material 8 to be chemically stable. The filling material 8 may be organic, inorganic or hybrid.

As particularly preferred filling materials, mention may be made of aromatic polymers, possibly thermally stable ones. Thus, use may be made of the polymer called SILK (sold by Dow Chemical) or of the polymer called FLARE (sold by Honeywell), which are aromatic non-porous polymers having a dielectric constant of about 2.7. The filling material 8 may be deposited in various ways. For example it may be envisaged to deposit it by CVD or by spin-on coating.

However, it is preferred, when this is possible, to deposit the filling material 8 by spin-on coating, especially when it is a polymer. This is because deposition by CVD takes place by growth of the filling material 8 on the walls of the trenches 6. Given the dimensions of the trenches 6, there would be a risk of forming a plug before the filling material 8 has been able to fill the open pores 7 in the layers 3 and 5 of the dielectric. This risk is avoided by spin-on deposition.

If the filling material 8 is deposited by spin-on coating, the material is in the form of a phase dispersion. A drop of the filling material 8 is then deposited on the device. Owing to the spinning, this drop spreads out and runs into the trenches 6 and then fills the open pores 7 in the layers 3 and 5 of the dielectric. This step is carried out for a time long enough to fill the entire open porous structure of the layers 3 and 5 of dielectric.

Once the filling material 8 has been deposited by spin-on coating it is then crosslinked so as to make it stable. The crosslinking may be carried out by various methods. It is possible to envisage a heat treatment at a temperature of about 400° C., or at a lower temperature. Care should then be taken not to exceed the decomposition temperature or melting point of the filling material 8. It is also possible to envisage crosslinking by treatment with UV radiation or else with an electron beam.

Figure 3:
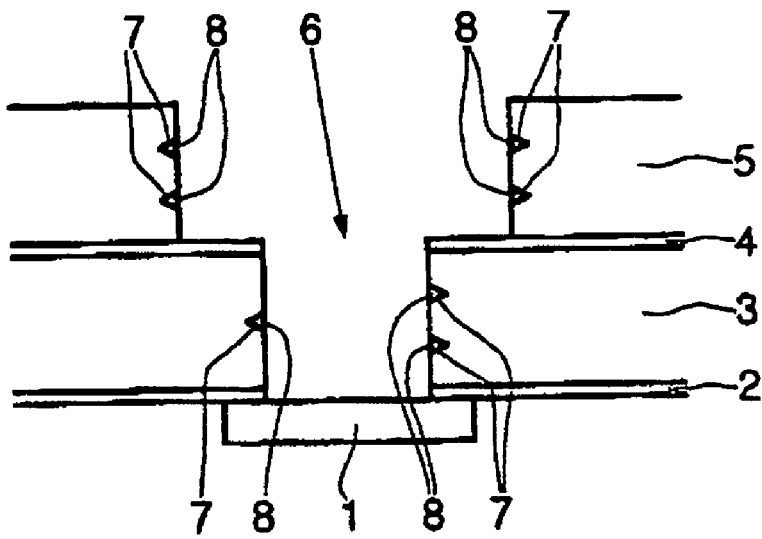

The filling material 8 is then removed from the surface of the damascene structure, except from the open pores 7 in the layers 3 and 5 of dielectric. This removal may be carried out by anisotropic etching using an oxidizing plasma. FIG. 3 shows the damascene structure at this stage in the process, the open pores 7 in the layers 3 and 5 of dielectric being filled with the crosslinked filling material 8.

The step of etching the filling material 8 may entail the metal 1 being spattered onto the walls of the trenches 6. To remove such contaminations, the wafer may be subjected to a cleaning step, for example liquid cleaning. This step also allows the traces of filling material 8 that may possibly have formed during the etching step to be removed. To complete the process, a metal diffusion barrier 9 and then an interconnect metal 10 are deposited in the trenches 6 of the semiconductor device (see FIG. 4).

The process has an additional advantage. Conventionally, during recrystallization of the metal, the grains of the metal grow laterally and may degrade the structure. The association between the filling material 8 and the dielectric has the advantage of laterally consolidating this structure, making it less friable. Next, the excess interconnect metal 10 is removed from the surface of the layer 5 of dielectric by chemical-mechanical polishing.

Figure 4:
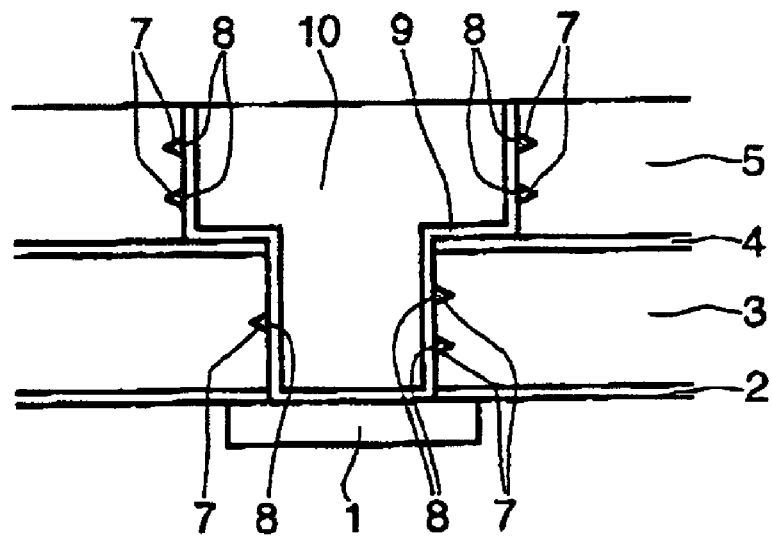

FIG. 4 shows the semiconductor device at the end of the damascene process. On top of the metal contact pad 1 there is the barrier layer 2, on top of which there is the layer 3 of dielectric. On the layer 3 there is the stop layer 4, and on the stop layer 4 there is the layer 5 of dielectric. The open pores 7 in the dielectric are filled with the filling material 8. The filling material 8, The trenches 6 are filled with the diffusion barrier 9 and the interconnect metal 10.

The semiconductor device thus produced with damascene interconnects may advantageously serve as a basis for the production of integrated circuits whose performance is improved since the risk of a short circuit, resulting from the diffusion of metal into the layers, is reduced. Furthermore, by incorporating the low-dielectric-constant filling material 8, the lateral capacitance between two metal lines of the semiconductor device is reduced. Consequently, the induced effects of one line on another are reduced.

The invention claimed is:

1. A semiconductor device comprising:
    an interconnect network comprising at least one dielectric layer having a trench, and at least one interconnect formed in the trench, the dielectric layer having pores;
    a filling material filling only in the pores between the dielectric layer and the interconnect; and
    a diffusion barrier layer between the interconnect and the dielectric layer, and in contact with the dielectric layer and the filling material.

2. The semiconductor device according to claim 1 wherein the at least one dielectric layer comprises two dielectric layers.

3. The semiconductor device according to claim 2 wherein the filling material fills pores in the two dielectric layers.

4. The semiconductor device according to claim 1 wherein the interconnect comprises copper.

5. The semiconductor device according to claim 1 wherein the filling material is a polymer.

6. The semiconductor device according to claim 1 wherein the filling material is a thermally stable aromatic polymer.

7. The semiconductor device according to claim 1 wherein the filling material has a melting point above 450° C.

8. The semiconductor device according to claim 1 wherein the filling material has a dielectric constant of less than four.

9. The semiconductor device according to claim 1 wherein the filling material has a dielectric constant preferably between 2.5 and 3.5.

10. The semiconductor device according to claim 1 wherein the filling material has a dielectric constant between 2.6 and 2.8.

11. The semiconductor device according to claim 1 wherein the filling material fills pores having a size of less than 100 nm.

12. The semiconductor device according to claim 1 wherein the filling material fills pores having a size of less than 20 nm.

13. The semiconductor device according to claim 1 wherein the filling material fills pores having a size of less than 10 nm.

14. A semiconductor device comprising:
    an interconnect network comprising a dielectric layer having a trench, and an interconnect formed in the trench, the dielectric layer having pores;
    a filling material only in the pores; and
    a diffusion barrier layer covering and in contact with the filled pores and the dielectric layer.

15. The semiconductor device according to claim 14 wherein the interconnect comprises copper.

16. The semiconductor device according to claim 14 wherein the filling material comprises a polymer.

* * * * *